US010671179B2

(12) United States Patent
Xia et al.

(10) Patent No.: US 10,671,179 B2
(45) Date of Patent: Jun. 2, 2020

(54) ROLLABLE AND FLEXIBLE INPUT DEVICE

(71) Applicant: SHENZHEN ROYOLE TECHNOLOGIES CO. LTD., Shenzhen, Guangdong (CN)

(72) Inventors: Xinyuan Xia, Guangdong (CN); Linyu Yu, Guangdong (CN); Songya Chen, Guangdong (CN); Yu Zhou, Guangdong (CN); Gang Chen, Guangdong (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/745,029

(22) PCT Filed: Dec. 30, 2015

(86) PCT No.: PCT/CN2015/099914
§ 371 (c)(1),
(2) Date: Jan. 15, 2018

(87) PCT Pub. No.: WO2017/113203
PCT Pub. Date: Jul. 6, 2017

(65) Prior Publication Data
US 2018/0210560 A1    Jul. 26, 2018

(51) Int. Cl.
*G06F 3/02* (2006.01)
*G06F 1/16* (2006.01)
(Continued)

(52) U.S. Cl.
CPC .......... *G06F 3/0221* (2013.01); *G06F 1/1626* (2013.01); *G06F 1/1632* (2013.01);
(Continued)

(58) Field of Classification Search
CPC ..... G06F 3/0221; H01M 2/1055; H05K 1/028
(Continued)

(56) References Cited

U.S. PATENT DOCUMENTS

2003/0025668 A1* 2/2003 Lin ................. G06F 3/0221
345/156
2006/0109244 A1* 5/2006 Bricaud ............... H01H 9/04
345/157
(Continued)

FOREIGN PATENT DOCUMENTS

CN    201754266 U    3/2011
CN    102279649 A    12/2011
(Continued)

OTHER PUBLICATIONS

International search report issued in corresponding international application No. PCT/CN2015099914 dated Mar. 24, 2016.

*Primary Examiner* — Calvin C Ma
(74) *Attorney, Agent, or Firm* — Hauptman Ham, LLP

(57) ABSTRACT

A rollable and flexible input device includes a drum, a reel received in the drum, an input device body connected to the reel, and a battery. The reel is rotated relative to the drum so that the input device body is in a rolled-up state or a stretched state. The reel defines a battery cavity, and the battery is disposed in the battery cavity.

19 Claims, 8 Drawing Sheets

(51) Int. Cl.
*H05K 1/02* (2006.01)
*H01H 13/86* (2006.01)
*H01M 2/10* (2006.01)

(52) U.S. Cl.
CPC ............... *G06F 3/02* (2013.01); *H05K 1/028* (2013.01); *H01H 13/86* (2013.01); *H01H 2223/052* (2013.01); *H01H 2223/06* (2013.01); *H01M 2/1055* (2013.01); *H01M 2220/30* (2013.01); *H05K 2201/051* (2013.01); *H05K 2201/10037* (2013.01)

(58) Field of Classification Search
USPC .................................................. 345/173, 174
See application file for complete search history.

(56) References Cited

U.S. PATENT DOCUMENTS

| | | | | |
|---|---|---|---|---|
| 2008/0303782 | A1* | 12/2008 | Grant | .................... G06F 1/1615 345/156 |
| 2014/0068473 | A1* | 3/2014 | Jano | ....................... G06F 1/1641 715/764 |
| 2015/0261264 | A1* | 9/2015 | Brown | ................... G06F 3/0221 345/174 |
| 2016/0263327 | A1* | 9/2016 | Radmer | .................. A61M 5/20 |
| 2017/0060183 | A1* | 3/2017 | Zhang | ................... G06F 1/1605 |

FOREIGN PATENT DOCUMENTS

| | | |
|---|---|---|
| CN | 102339177 A | 2/2012 |
| CN | 103605409 A | 2/2014 |
| CN | 104718513 A | 6/2015 |
| JP | 2006172942 A | 6/2006 |
| JP | 2011040314 A | 2/2011 |
| JP | 2014098304 A | 5/2014 |
| JP | 2015534695 A | 12/2015 |
| WO | 0135202 A1 | 5/2001 |

* cited by examiner

US 10,671,179 B2

ROLLABLE AND FLEXIBLE INPUT DEVICE

RELATED APPLICATIONS

The present application is a National Phase of International Application Number PCT/CN2015/099914, filed Dec. 30, 2015.

TECHNICAL FIELD

The present disclosure relates to the filed of telecommunication, and particularly to a rollable and flexible input device.

BACKGROUND

Electronic devices such as mobile phones, pocket computers, and laptops are widely used in life. Users usually operate the electronic devices through a touch screen or an external keyboard. With the development of high-technology, consumers' demands to the portability and diversity of the electronic devices are increasingly high, for example, reducing the volume of the electronic devices for portability, and providing a touch screen to improve the operability. However, it obviously increases the user's burden if an external keyboard is additionally carried for the sake of easy operation. For this reason, a flexible keyboard is designed in the related art, which can be rolled and stored in a drum for easy storage and carrying. A battery of the existing rollable keyboard, usually installed in a battery compartment which is independently arranged in an end portion of the drum of the rollable keyboard, needs to occupy an additional space, which particularly increases the length of the drum, thus it is inconvenient to carry the existing rollable keyboard.

SUMMARY

Embodiments of the present disclosure provide a rollable and flexible input device, in which a battery is received in a reel, thus the rollable and flexible input device has a reduced overall dimension, and is designed to be easily carried.

The rollable and flexible input device includes a drum, a reel received in the drum, an input device body connected to the reel, and a battery. The reel is rotated relative to the drum so that the input device body is in a rolled-up state or a stretched state. The reel defines a battery cavity, and the battery is disposed in the battery cavity.

Wherein, the battery is rotated along with the rotation of the reel.

Wherein, the rollable and flexible input device further includes a circuit board, the reel further defines a circuit board cavity for receiving the circuit board, and the circuit board is rotated along with the rotation of the reel.

Wherein, the circuit board cavity and the battery cavity are separated by a separator arranged in the reel, and the battery is electrically coupled to the circuit board.

Wherein, the circuit board cavity and the battery cavity are arranged in alignment, and a volume of the battery cavity is smaller than that of the circuit board cavity.

Wherein, the reel includes a first shaft body and a second shaft body separable from the first shaft body, and the battery and the circuit board are clamped between the first shaft body and the second shaft body.

Wherein, the first shaft body and the second shaft body are connected to each other via snapping.

Wherein, the battery cavity is provided with protruding ribs spaced from each other, and the protruding ribs support the battery and position the battery in the reel.

Wherein, two opposite ends of the reel are respectively provided with end plates and rotating shafts each protruding from one end plate, the two end plates respectively cover an end of the battery cavity and an end of the circuit board cavity opposite to the end of the battery cavity, the rotating shafts are inserted on the drum, and the reel is rotatably arranged on the drum through the rotating shafts.

Wherein, the first shaft body includes two end walls respectively connected to the two end plates, the height of the end wall is smaller than that of the end plate, and the second shaft body is provided with a positioning post facing the end wall and inserted in the end wall.

To sum up, for the rollable and flexible input device of the present disclosure, the reel is designed as a dismountable structure, and the battery is installed in a cavity of the reel, without the need of additionally providing a structure on the drum for accommodating the battery, thus, the overall structure is compact, and the rollable and flexible input device has a reduced overall volume, and is designed to be easily carried.

BRIEF DESCRIPTION OF THE DRAWINGS

In order to illustrate the technical solutions of embodiments of the present disclosure more clearly, the accompanying drawings which need to be used in the embodiments will be briefly described. Apparently, the accompanying drawings described in the following description are for some embodiments of the present disclosure, and a person ordinarily skilled in the art still can obtain other accompanying drawings according to these accompanying drawings without any creative effort.

DETAILED DESCRIPTION

Figure 1:
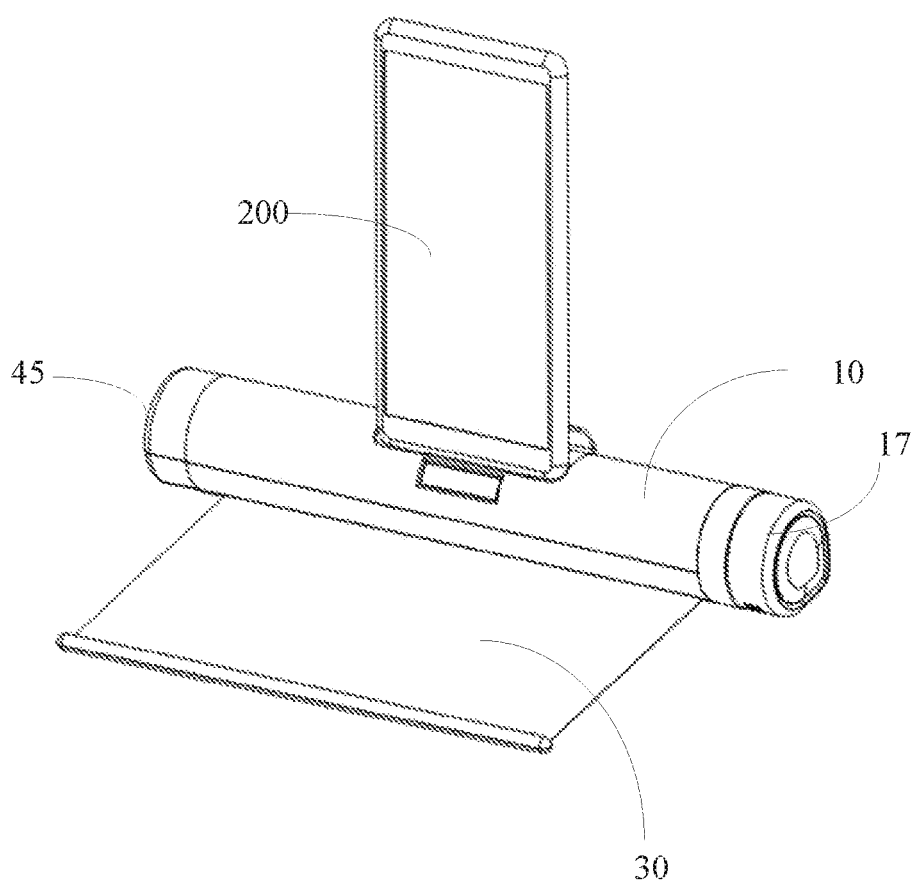
FIG. 1 is a perspective schematic view of a rollable and flexible input device provided in the present disclosure, showing an electronic device arranged on a drum.

The present disclosure provides a rollable and flexible input device. The rollable and flexible input device related to embodiments of the present disclosure are used for, but not limited to, mobile phones, tablet computers, pocket computers, personal digital assistants (PDAs), electronic readers and so on, and no specific limitation is made thereto in the embodiments of the present disclosure.

Referring to FIG. 1 to FIG. 4, in the embodiment, the rollable and flexible input device may include a drum 10, a reel 20, an input device body 30 connected to the reel 20, a driving portion (not indicated in the figures) connected to the reel 20, a battery 50, and a circuit board 60. The drum 10 is provided with loudspeakers 70 and 80 (see FIG. 8 and FIG. 11) and a touch control switch component 90. The input device body 30 may be a flexible keyboard or a flexible writing pad. The battery 50 and the circuit board 60 are received in the reel 20. The reel 20 and the driving portion are received in the drum 10. The driving portion drives the reel 20 to rotate so that the input device body 30 is rolled up onto or released from the reel 20. An end of the input device body 30 is exposed from the drum 10 so that the input device body 30 can be stretched out from the drum 10. The battery 50 is electrically coupled to the circuit board 60. The input device body 30 is electrically coupled to the circuit board 60. The loudspeakers 70 and 80 are respectively located at two end positions of the drum 10 for playing audio messages from an electronic device which employs the rollable and flexible input device. The input device body 30 of the present disclosure is a flexible and rollable flexible keyboard.

Figure 2:
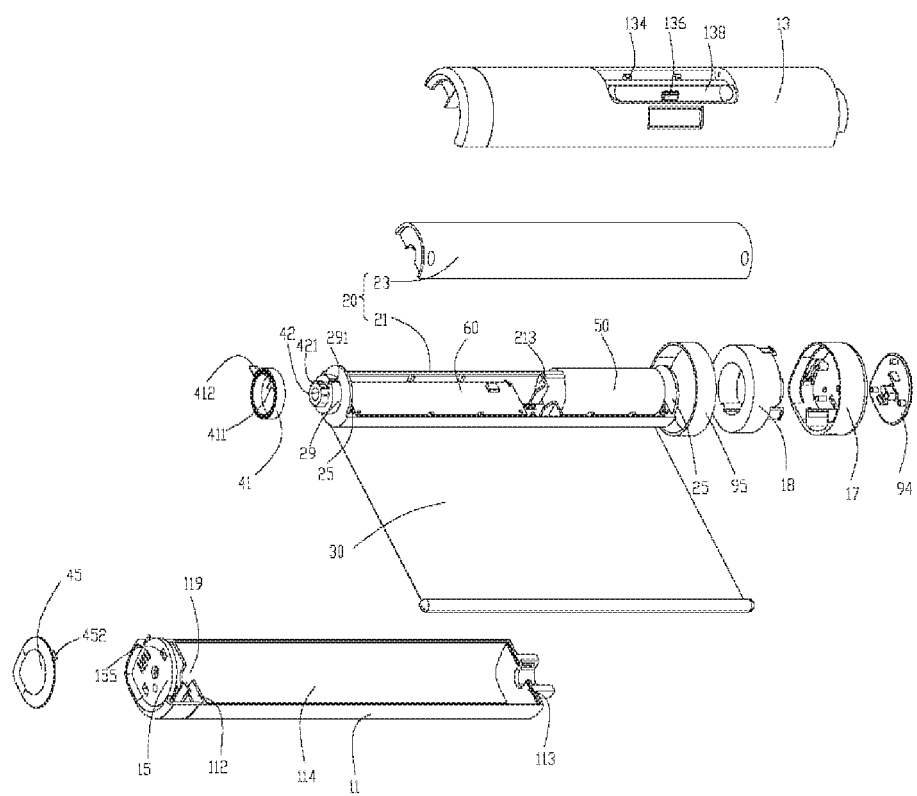
FIG. 2 is an exploded schematic view of the rollable and flexible input device shown in FIG. 1.

Referring to FIG. 2, in the embodiment, the drum 10 may include a hollow cylindrical body (not indicated in the figures), an outer end plate 15, and an end cover 17. The body may include a first housing 11 and a second housing 13 structurally symmetrical to the first housing 11. It also can be understood that the drum 10 may include the first housing 11 and the second housing 13 arranged opposite to the first housing 11. The first housing 11 and the second housing 13 are formed by partitioning the drum 10 along an axis of the drum 10. In the embodiment, the first housing 11 constitutes an upper half of the drum 10, while the second housing 13 constitutes a lower half of the drum 10. The first housing 11 includes a first end 1111 and a second end 1112. The first housing 11 may include an arc-shape face 111 with a section in semicircular shape and two first end plates 112 and 113 opposite each other. The first end 1111 and the second end 1112 are two ends of the first housing 11 which are located on an axis of the first housing 11. The first end plate 112 and the first end plate 113 are arranged on the arc-shape face 111 opposite each other. The first end plates 112 and 113 and the arc-shape face 111 located between the first end plates 112 and 113 define a first groove 114, and the first end plate 112 and the first end plate 113 are groove walls of the first groove 114. The first end plate 112 is a thin plate with a section in semicircular shape, and is arranged on a position of the arc-shape face 111 close to the first end 1111. The arc-shape face 111 between the first end plate 112 and the first end 1111 is further provided with a first vertical plate 118 (shown in FIG. 4). A first end groove 116 is defined between the first vertical plate 118 and the first end 1111. A second groove 117 is defined between the first vertical plate 118 and the first end plate 112. The first end plate 113 is arranged on the second end 1112 and closes the second end 1112.

Figure 5:
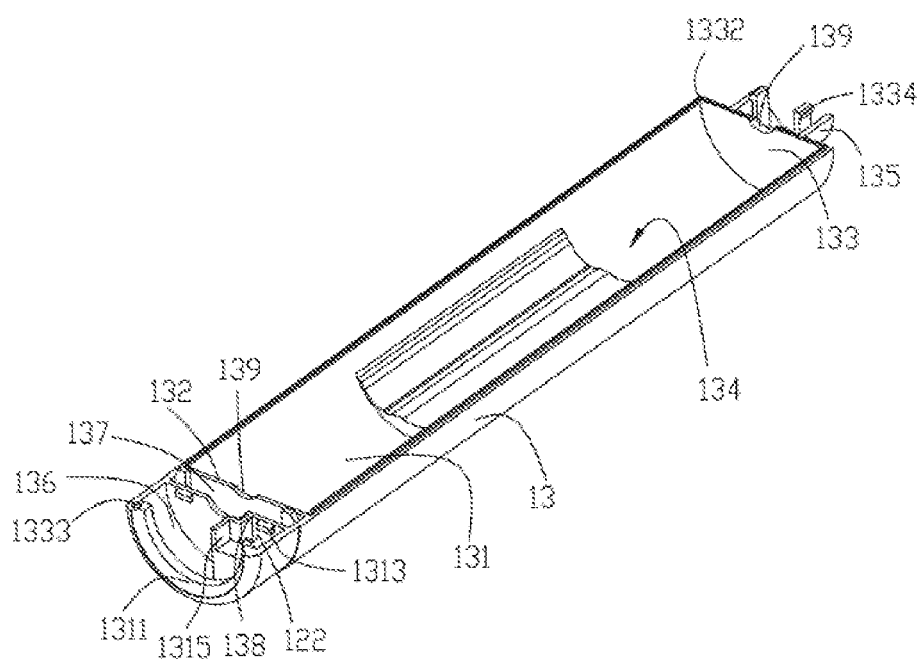
FIG. 5 is a structural schematic view of a second housing of the rollable and flexible input device shown in FIG. 2.

Referring to FIG. 5, the second housing 13 may include a third end 1311, a fourth end 1332, an arc-shape face 131 with a section in semicircular shape, and two second end plates 132 and 133 opposite each other. The third end 1311 and the fourth end 1332 are two ends of the second housing 13 which are located on an axis of the second housing 13. The second end plate 132 and the second end plate 133 are arranged on the arc-shape face 131 opposite each other. The second end plates 132 and 133 and the arc-shape face 131 located between the second end plates 132 and 133 define a third groove 134. The second end plate 132 is a thin plate with a section in semicircular shape, and is arranged on a position of the arc-shape face 131 close to the third end 1311. The arc-shape face 131 between the second end plate 132 and the third end 1311 is further provided with a second vertical plate 138. A second end groove 136 is defined between the second vertical plate 138 and the third end 1311. A fourth groove 137 is defined between the second vertical plate 138 and the second end plate 132. The second end plate 133 is arranged on the fourth end 1332 and closes the fourth end 1332. In the present disclosure, the first housing 11 is buckled with the second housing 13, the first groove 114 is butted with the third groove 134 to define a receiving cavity, the second groove 117 is butted with the fourth groove 137 to define a second cavity, the first end groove 116 is butted with the second end groove 136 to define a first cavity, and the first end 1111 is butted with the third end 1311 to define an end opening (not indicated in the figures). The first cavity is located at one end of the drum 10 and communicates with the outside through the end opening. The outer end plate 15 covers the end opening to close the first cavity. The receiving cavity, the second cavity, and the first cavity are arranged sequentially along the axis of the reel 10.

Furthermore, each of the first end plate 112 and 113 defines a notch 119. Each of the second end plate 132 and 133 defines a notch 139. A semicircular tube body 115 coaxial with the first housing 11 protrudes outwardly along a circumferential edge of the notch 119 of the first end plate 113. A semicircular tube body 135 coaxial with the second housing 13 protrudes outwardly along a circumferential edge of the second end plate 133 close to the notch 139. When the first housing 11 is buckled with the second housing 13, the two first end plates 112 and 113 are respectively butted with the two second end plates 132 and 133, and the notches 119 of the first end plates 112 and 113 are butted with the corresponding notches 139 of the second end plates 132 and 133 to define axle holes. That is to say, when the first end plate 112 is butted with the second end plate 132, the notch 119 and the notch 139 define one axle hole, and when the first end plate 113 is butted with the second end plate 133, the notch 119 and the notch 139 define another axle hole. Meanwhile, the semicircular tube body 115 and the semicircular tube body 135 form a protruding tube 14 (see FIG. 7). The protruding tube 14 protrudes from one end of the drum 10. The two axle holes both communicate with the receiving cavity. The reel 20 is received in the receiving cavity, and two opposite ends are rotatably installed in the two axle holes. The first end plate 113 is butted with the second end plate 133 to form a main end plate of the drum 10. The main end plate and the above end opening respectively constitute two opposite end portions of the body, i.e. the drum 10. The outer end plate 15 covers the end opening. The end cover 17 is close to the main end plate.

Figure 3:
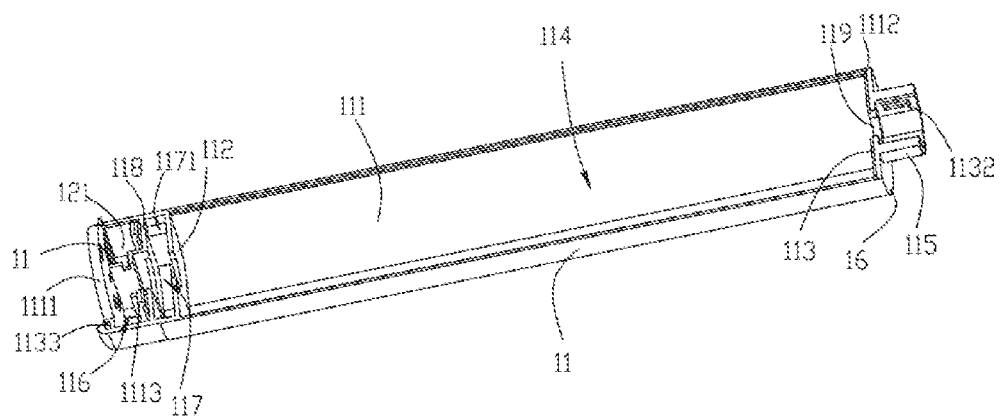
FIG. 3 is a structural schematic view of a first housing of the rollable and flexible input device shown in FIG. 2.
Figure 4:
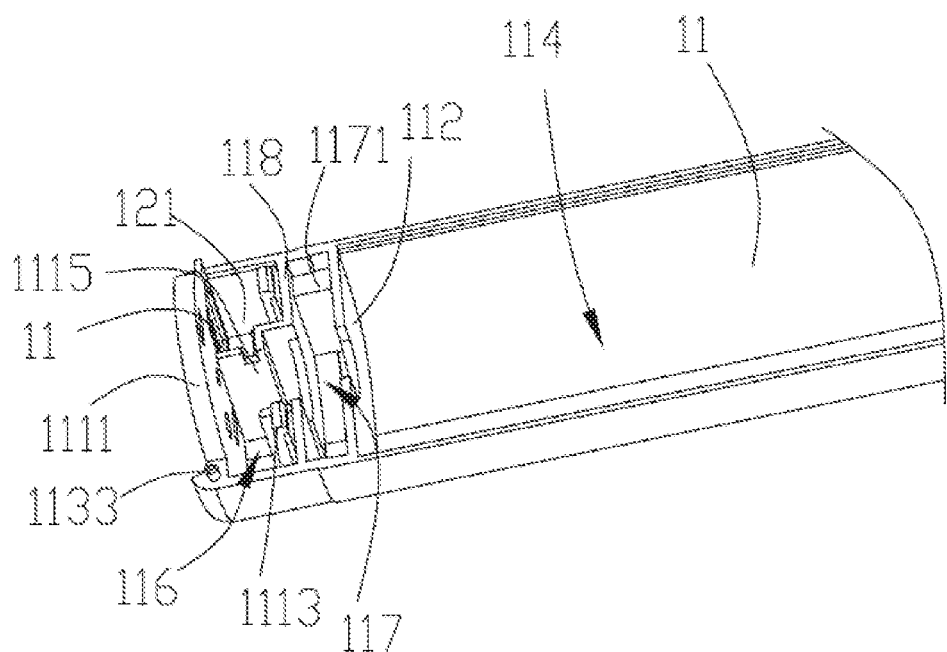
FIG. 4 is a partially enlarged structural schematic view of the first housing of the rollable and flexible input device shown in FIG. 3.

Referring to FIG. 2 to FIG. 5 again, a clamping portion near the first end plate 112 of the two first end plates 112 and 113 is provided. The first housing 11 outside the other first end plate 113 is provided with a clamping portion. The two second end plates 132 and 133 are respectively provided with snapping portions corresponding to the clamping portions of the two first end plates 112 and 113. The clamping portion is a snap, a positioning post, a clamping groove, or a positioning hole. The snapping portion is a snap, a positioning post, a clamping groove, or a positioning hole cooperating with the clamping portion. Referring to FIG. 2 and FIG. 3, specifically, in the embodiment, a face of the semicircular tube body 115 of the first end plate 113 with the same orientation as the arc-shape face 111 defines two clamping grooves 1132. The semicircular tube body 135 of the second end plate 133 opposite to the first end plate 113 is provided with two snaps 1334 clamped with the clamping grooves 1132. The arc-shape face 111 of the first housing 11 is provided with a snap 1113 near to the first vertical plate 118, and the first vertical plate 118 is close to an outer side of the first end plate 112. A lateral side of the first housing 13 close to the first end 1111 is provided with a positioning post 1133. Correspondingly, the second vertical plate 138 which is arranged on the second housing 13 and outside the second end plate 132 is provided with a clamping protrusion 1313. A lateral side of the second housing 11 close to the third end 1311 defines a positioning hole 1333. The snap 1113 of the first housing 11 is clamped with the clamping protrusion 1313 of the second housing 13, the clamping groove 1132 of the first housing 11 is snapped with the snap 1334 of the second housing 13, and the positioning post 1133 of the first housing 11 is inserted in the positioning hole 1333 of the second housing 13, so as to realize the snapping between the first housing 11 and the second housing 13. In other embodiments, the clamping portions may be arranged on the two second end plates 132 and 133, and the snapping portions may be arranged on the two first end plates 112 and 113, as long as the clamping and fixing between the first housing 11 and the second housing 13 can be realized.

In the present disclosure, the first housing 11 and the second housing 13 are buckled to form the drum 10. Through the clamping and fixing between the clamping portions and the snapping portions, it is not only convenient to assemble elements such as the reel 20 and the input device body 30 in the drum 10, but also easy to exchange and maintain the drum 10, the reel 20, or the input device body 30, substantially without the need of dismounting other elements in the drum 10, which can ensure preciseness of positions of other elements, save dismounting time, and decrease dismounting difficulty.

Furthermore, the first housing 11 or the second housing 13 defines a gap along an axial direction. Further, a surface of the first housing 11 or the second housing 13 facing away from the receiving cavity defines an installation groove 138. In the embodiment, as shown in FIG. 3, the gap 16 is defined on the first housing 11 and runs through the receiving cavity. The input device body 30 extends out from the drum 10 through the gap 16.

In the embodiment, an inner side wall of the installation groove 138 is provided with a flexible abutment protrusion 134 and a connector plug (not indicated in the figures). The installation groove 138 is used for connecting and fixing an electronic device 200 so as to facilitate operating the input device body 30 with respect to the electronic device. The flexible abutment protrusion 134 is used for positioning the electronic device 20. The installation groove 138 is also provided with a connector plug 136 therein. The connector plug 136 can be connected to the electronic device 200, and connected to the circuit board, so as to use the loudspeakers 70 and 80 on the drum 10 for amplification. The electronic device 200 also can be charged by the battery 50.

Figure 6:
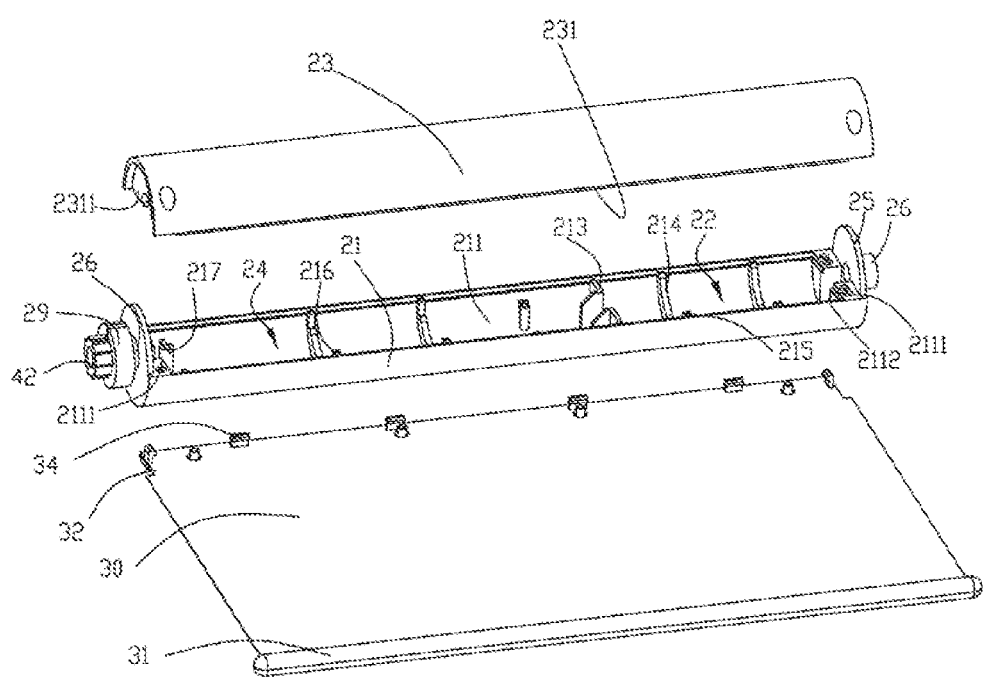
FIG. 6 is an exploded schematic view of a first shaft body and a second shaft body of a reel and an input device body of the rollable and flexible input device shown in FIG. 2.

Referring to FIG. 2 and FIG. 6, the reel 20 may include a first shaft body 21 and a second shaft body 23 divided along the axis of the reel 20. The reel 20 may further include end plates 25 located at two opposite ends of the reel 20 and rotating shafts 26 each protruding from one end plate 25. The reel 20 is a hollow tube body. Cross sections of the first shaft body 21 and the second shaft body 23 have a semicircular structure. The first shaft body 21 defines a first accommodating groove 211. The second shaft body 23 defines a second accommodating groove 231. A groove inner wall (not indicated in the figures) of the first accommodating groove 211 is an arc-shape face, and is provided with a separator 213 protruding from thereto. The first accommodating groove 211 and the second accommodating groove 231 are buckled to define a cavity, and the cavity is divided into a battery cavity 22 and a circuit board cavity 24 by the separator 213. For the sake of easy understanding, guide lines of reference numerals of the battery cavity 22 and the circuit board cavity 24 in the figures point to a part of the cavity of the first shaft body 21. The battery 50 is disposed in the battery cavity 22. The circuit board 60 is disposed in the circuit board cavity 24. The battery 50 is electrically coupled to the circuit board 60 and supplies power to the input device body 30. In the embodiment, the second accommodating groove 231 is further provided with a separator (not shown in the figures) corresponding to the separator 213, and the separator 213 is butted with the separator in the second accommodating groove 231 to separate the battery cavity 22 and the circuit board cavity 24. Furthermore, the two end plates 25 are respectively arranged on two ends of the first accommodating groove 211 and close the two ends of the cavity, the rotating shafts 26 are located outside the end plates 25, and the reel 20 is rotatably installed in the axle hole of the drum 10 through the rotating shafts 26. All of the two end plates 25, the rotating shafts 26, and the separator 213 are provided with wiring holes (not shown in the figures) communicating with the first accommodating groove 211.

The reel 20 of the rollable and flexible input device of the present disclosure is designed as a dismountable structure, the battery 50 is installed inside the cavity of the reel 20, without the need of additionally providing a structure on the drum for accommodating the battery 50, so that the overall structure is compact, the rollable and flexible input device has a reduced overall volume, and is designed to be easily carried. Moreover, installing the circuit board 60 inside the reel 20 can further reduce the overall volume.

Furthermore, the groove inner wall of the first accommodating groove 211 located in the battery cavity 22 is provided with a first protruding rib 214 and a second protruding rib 215. The first protruding rib 214 and the second protruding rib 215 are located at two opposite sides of the groove inner wall, and the first protruding rib 214 and the second protruding rib 215 together support and clamp the battery 50. Specifically, the first protruding rib 214 and the second protruding rib 215 are located at two opposite sides of the groove inner wall which are divided by an axis of the groove inner wall. Surfaces of the first protruding rib 214 and of the second protruding rib 215 facing the battery 50 are arc-shape faces, for facilitating fitting with the surface of the battery 50, thus the clamping is more stable. A vertical post 217 protrudes from the groove inner wall of the first accommodating groove 211 located in the circuit board cavity 24, towards an axis direction perpendicular to the first accommodating groove 211. The vertical post 217 defines a screw hole. The vertical post 217 supports the circuit board 60 and is screw-fixed to the screw hole via a bolt (not shown in the figures) passing through the circuit board 60. Specifically, the circuit board 60 defines a through hole corresponding to the screw hole for the bolt to pass therethrough. It can be understood that a groove inner wall of the second accommodating groove 231 located in the battery cavity 22 also may be provided with protruding ribs (not indicated in the figures) corresponding to the first protruding rib 214 and the second protruding rib 215, for clamping the battery 50 together with the first protruding rib 214 and the second protruding rib 215, so as to enhance the stability of the battery.

Furthermore, the first shaft body 21 defines a positioning hole towards the second shaft body 23. The second shaft body 23 is provided with a positioning post corresponding to the positioning hole. The first shaft body 21 is buckled with the second shaft body 23, and the positioning post is clamped in the positioning hole so as to fix the first shaft body 21 to the second shaft body 23. Specifically, the first accommodating groove 211 has two end walls 2111. The two end walls 2111 respectively lie against the two end plates 25. Each of the two end walls 2111 defines a positioning hole 2112 towards the second accommodating groove 231. The second accommodating groove 231 has two end walls 2311. Each of the two end walls 2311 is provided with a positioning post (not indicated in the figures) in a place corresponding to the positioning hole 2112. The first shaft body 211 is buckled with the second shaft body 231, the end walls 2311 of the second accommodating groove 231 are butted to the end walls 2111 of the first accommodating groove 211, and the positioning posts are clamped in the positioning holes 2112 so as to fix the first shaft body 21 to the second shaft body 23.

Furthermore, the first shaft body 21 defines several clamping grooves 216. In the embodiment, the clamping grooves 216 run through the first accommodating groove 211. It can be understood that the clamping grooves 216 may be defined on the second shaft body 23. The input device body 30 is provided with a connecting plate 32 at one end. The connecting plate 32 is provided with hooks 34 corresponding to the clamping grooves 216. The connecting plate 32 is fixed to the reel 20 through the clamping of the clamping grooves 216 with the hooks 34. The input device body 30 is provided with a stop position 31 at the other end. When the input device body 30 is rolled up onto the reel 20 and received in the drum 10, the stop position 31 is located outside the gap 16 and abuts against the drum 10. When the input device body 30 is rolled onto the reel 20, the stop position 31 abuts against the drum 10 to prevent the input device body 30 from being completely pulled into the receiving cavity of the drum 10. When the input device body 30 needs to be used, it is convenient to stretch the input device body 30 by holding the stop position 31.

Figure 7:
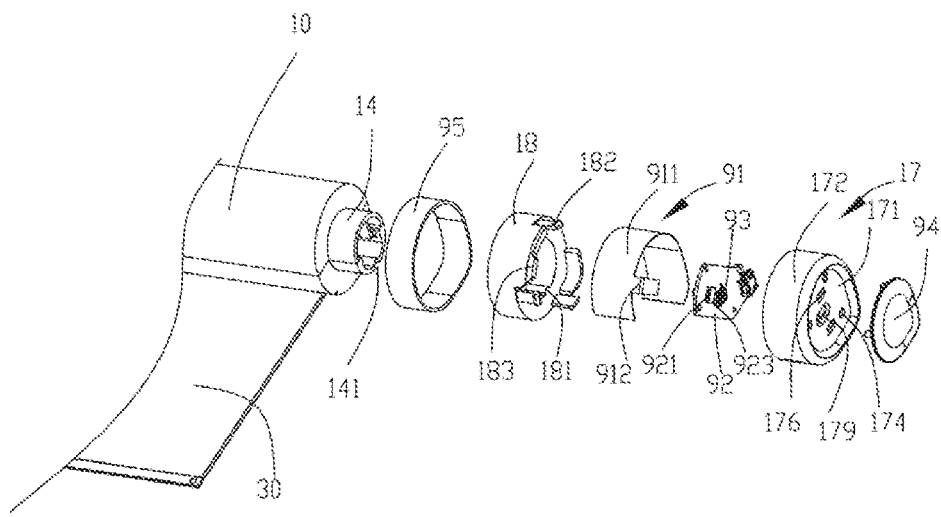
FIG. 7 is a partial structural schematic view of the rollable and flexible input device shown in FIG. 1.

Referring to FIG. 7, furthermore, the drum 10 further includes a limit ring 18. The limit ring 18 is a ring-shape block made from a light-passing material. The limit ring 18 is sleeved on the protruding tube 14 and is fixed to the protruding tube 14 via clamping. The end cover 17 is fixed to the limit ring 18 via clamping. In the embodiment, the limit ring 18 and the protruding rube 14 form positioning structures positioned with respect to each other. In the embodiment, the positioning structure includes a recess 141 arranged outside the protruding tube 14, and a protrusion 181 arranged on an inner annular wall of the limit ring 18 and corresponding to the recess 141. The protrusion 181 is clamped in the recess 141 so as to position the limit ring 18 to the drum 10. The manner that the limit ring 18 is sleeved on an end of the drum 10 further fixes the first housing 11 to the second housing 13, ensuring the stability. The end cover 17 includes a bottom plate 171 and a circumferential plate 172 located at a circumferential edge of the bottom plate 171. The circumferential plate 172 is provided with a clamping concave portion 173 (see FIG. 11) at an inner side. An end face of the limit ring 18 is provided with a clamping protrusion 182 corresponding to the clamping concave portion 173. The clamping protrusion 182 is clamped with the clamping concave portion 173 so as to fix the end cover 17 to the drum 10. It can be understood that the recess 141 may be defined on an inner annular wall of the limit ring 18, and the protrusion 181 may be arranged on an outer side of the protruding tube 14. It can be understood that the clamping protrusion 182 may be arranged on the circumferential plate 172 of the end cover 17, and the clamping concave portion 173 may be arranged on an end face of the limit ring 18. In the embodiment, a side of the limit ring 18 is bonded to a side face of the drum 10 through an adhesive so as to realize fixing between the limit ring 18 and the drum 10. It can be understood that in order to facilitate overall installation and dismount, the limit ring 18 also may be provided with a snapping structure oriented towards the drum 10, the drum 10 is also correspondingly provided with a clamping structure, and the fixing between the limit ring 18 and the drum 10 is realized through the buckling of the snapping structure and the clamping structure. The limit ring 18 is preferably made from an elastic material so as to provide better tactile feedback.

Referring to FIG. 2 and FIG. 8 to FIG. 10, furthermore, the driving portion of the present disclosure includes a spiral spring 41, a ratchet 42, a limit element, and a driving button 45. In the embodiment, the limit element is a limit pad 43 perpendicular to an end face of the ratchet 42. Correspondingly, in order to position the spiral spring 41, a rotating body 29 coaxial with the reel 20 is fixed on the rotating shaft 26 on an end face of the reel 20. The rotating body 29 is located in the second cavity and is provided with a first clamping position 291 at an outer circumference. An inner wall of the second cavity is provided with a second clamping position 292. In the embodiment, an inner surface of the second groove 117 is provided with a first boss 1171, an inner surface of the fourth groove 137 is provided with a second boss, and the first boss 1171 is butted with the second boss to define a clamping gap. The clamping gap is the second clamping position 292.

The spiral spring 41 includes a first end 411 and a second end 412. The spiral spring 41 is sleeved on the rotating body 29. The first end 411 is clamped with the first clamping position 291, and the second end 412 is clamped with the second clamping position 292. The ratchet 42 is fixed to an end face of the rotating body 29 and is coaxial with the rotating body 29. The ratchet 42 is received in the first cavity. The ratchet 42 includes several gear teeth 421. The limit pad 43 is arranged protruding in the first cavity. The limit pad 43 is used to abut against the gear teeth 421 for locking the reel 20.

Figure 8:
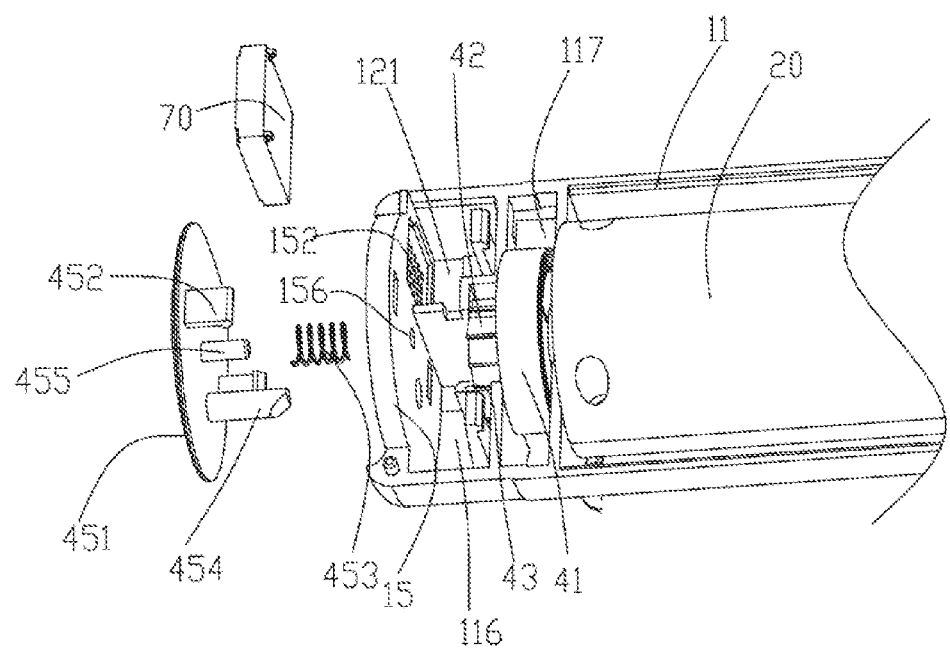
FIG. 8 is a partially assembled schematic view of a driving portion of the rollable and flexible input device shown in FIG. 2.
Figure 9:
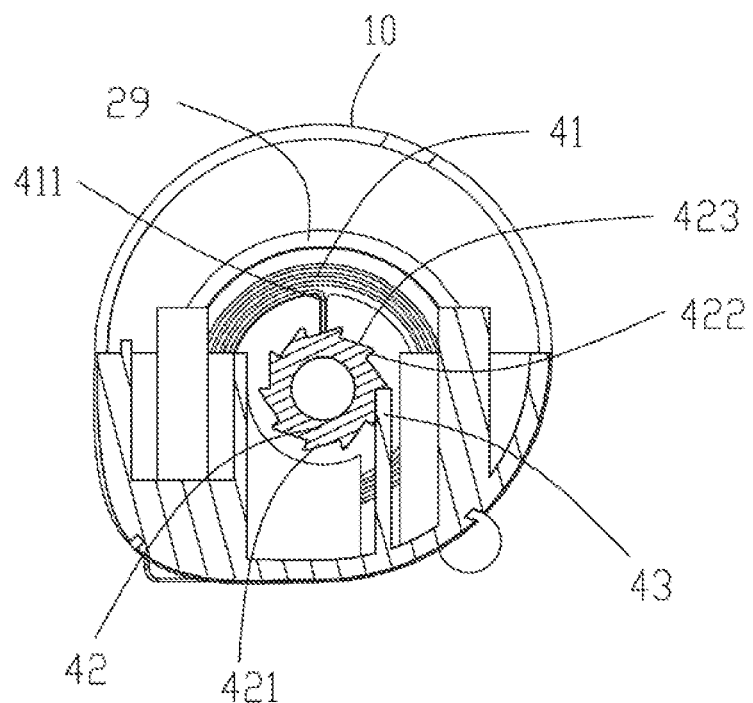
FIG. 9 and FIG. 10 are sectional schematic views of a driving portion shown in FIG. 7, taken along different section lines.
Figure 10:
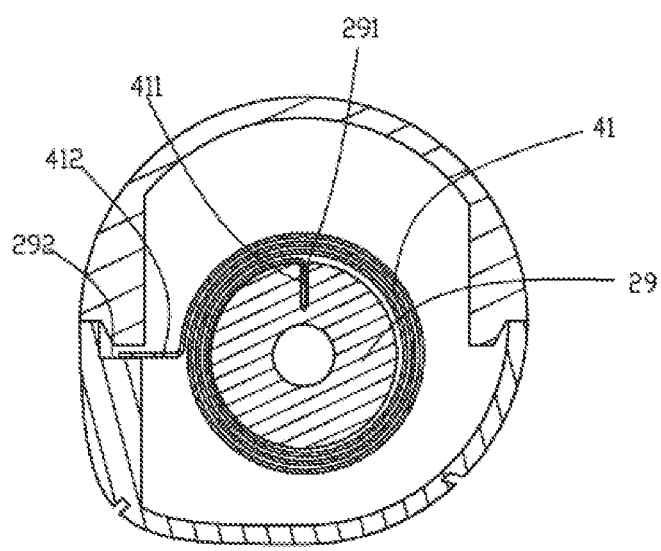

Referring to FIG. 8, the driving button 45 includes a press board 451 and a limit snap 452, a spring 453, and an abutment body 454 arranged on a surface of the press board 451. The outer end plate 15 defines a limit clamping groove 155 and a through hole 156. The limit snap 452 is clamped in the limit clamping groove 155. The driving button 45 further includes a supporting post 455 extending from the press board 451 towards the ratchet 42. The driving button 45 is arranged at an end portion of the drum 10. The spring 453 is sleeved on the supporting post 455 and abuts against the press board 451 and the outer end plate 15. The abutment body 454 passes through the through hole 156 and the first cavity and abuts against the limit pad 43. The abutment body 454 abuts against and presses the limit pad 43, then the limit pad 43 is inclined to be separated from the gear teeth 421 so as to release the ratchet 42. Referring to FIG. 4 and FIG. 8, in the embodiment, the first vertical plate 118 defines an opening, the limit pad 43 is arranged in the first end groove 116 of the first housing 11 and is adjacent to the first vertical plate 118, and the limit pad 43 is located on the side of the opening and faces the gear teeth 421 of the ratchet 42. In the embodiment, an end portion of the abutment body 454 has an abutment slope. The abutment slope abuts against the limit pad 43 for easily pushing the limit pad 43. When the abutment slope abuts against the limit pad 43, the abutment slop pushes the limit pad 43 to deform outwardly, so that the limit pad 43 is separated from the ratchet 42.

In the embodiment, the first end 411 of the spiral spring 41 is located on an outer circumference of the spiral spring 41, and the second end 412 is located in an inner ring of the spiral spring 41. The rotating body 29 is a disc coaxial with the reel 20, and the rotating body 29 is sleeved on one rotating shaft 26 of the reel 20 and fixed to the rotating shaft 26. The ratchet 42 has a side face perpendicular to an axis of the ratchet 42, and the side face of the ratchet 42 lies on the end face of the rotating body 29 and is coaxial with the reel 20. The gear teeth 421 of the ratchet 42 are inclined teeth inclined in the same direction with respect to the axis of the ratchet 42. In the embodiment, the gear teeth 421 are inclined clockwise. Each gear tooth 421 includes a stop face 422 and a guide slope 423 angularly connected to the stop face 422. The limit pad 43 is made from a plastic material and is resilient. The limit pad 43 extends vertically upwards and has a vertical side face and a horizontal top face which are close to the ratchet 42. When the input device body 30 is pulled to stretch, the reel 20 is driven by the input device body 30 to rotate anticlockwise, and the ratchet 42 is driven by the reel 20 to also rotate anticlockwise. When the ratchet 42 is rotated anticlockwise, the guide slopes 423 thereof abut against the vertical side face of the limit pad 43 one by one, so as to guide the rotation of the ratchet 42. Once the input device body 30 is stopped from being pulled, the stop face 422 of the ratchet 42 abuts against the horizontal top face of the limit pad 43, so as to limit the ratchet 42. Moreover, in the process of stretching the input device body 30, the spiral spring 41 is stretched to generate a resilience force. When the input device body 30 needs to be released, the limit pad 43 is inclined by pressing the limit pad 43 with the driving button 45, so that the horizontal top face is separated from the stop face 422 to release the ratchet 42. Under the effect of the resilience force of the spiral spring 41, the ratchet 42 and the reel 20 are rotated clockwise, so that the input device body 30 is automatically rolled up. When the pressing of the driving button 45 is released, the limit pad 43 returns, and the horizontal top face of the limit pad 43 again abuts against the stop face 422 of the ratchet 42, so as to limit the ratchet 42, and prevent the input device body 30 from being rolled up. In this way, by selectively releasing the driving button 45, the input device body 30 can be stretched to any position. In the embodiment, all the stop faces 422 are located in a radial direction of the ratchet 42.

In the embodiment, when the input device body 30 is released from the reel 20, the ratchet is rotated anticlockwise, and the spiral spring 41 is deformed to store an elastic potential energy. A rotating direction of the reel 20 for taking back the input device body 30 is clockwise. The limit pad 43 is unlocked from the gear tooth 421, and the spiral spring 41 releases the elastic potential energy to generate a resilience force to make the reel 20 rotate, so as to take back the input device body 30. Moreover, since the battery and the circuit board are installed in the reel 20, the weight of the reel 20 is increased, then the resilience force of the spiral spring 41 when rebounding is reduced, then the back-rotating speed of the reel 20 is decreased, which can prevent the input device body 30 from being broken. The driving portion of the present disclosure, just by means of the ratchet 42 and the limit pad 43, can realize roll-up of the reel 20, releasing of the input device body 30, and the locking to the reel 20, resulting in a simple structure, saving the space of the drum 10, and facilitating the operation.

It can be understood that if only the reel 20 needs to be driven, the driving portion may be a driving motor, and the driving portion is located at an end of the drum 10 and electrically coupled to the driving button 45.

Referring to FIG. 7, the switch component 90 of the present disclosure includes a flexible touchpad 91, a wiring board 92 electrically coupled to the circuit board 60, a protecting layer 95, a switch 93 arranged on a surface of the wiring board 92, and a key 94 arranged on the end cover 17. The flexible touchpad 91 is used to realize the regulation of the volume of the loudspeakers 70 and 80 on the drum 10. For example, the volume is decreased when a finger slides along the flexible touchpad 91 from up to down, and the volume is increased when a finger slides along the flexible touchpad 91 from down to up. The flexible touchpad 91 can be fixed to the limit ring 18 merely by pasting the former onto the latter, resulting in a simple structure, saving the space, and facilitating the operation. Besides, apart from the loudspeakers 70 and 80, the flexible input device of the present disclosure further may include other electronic elements, such as a lighting source and a projector, and the flexible touchpad 91 also can control these electronic elements, for example, adjusting the color of the lighting source, and adjusting the brightness of the projector.

In the embodiment, the flexible touchpad 91 includes an arc-shape strip main body 911 and a connection section 912 located at a side of the main body 911. The connection section 912 extends along an axis direction of the main body 911. The main body 911 is a touchpad functional zone for realizing the touch control function. The wiring board 92 is received in the end cover 17 and perpendicular to the circuit board 60. The wiring board 92 defines a connection port 921, and the connection section 912 is inserted into the connection port 921 to realize the electrical connection between the flexible touchpad 91 and the wiring board 92. Preferably, the connection section 912 is a flexible circuit board. A supporting piece 183 protrudes from an end face of the limit ring 18 along the axial direction of the limit ring 18, and the supporting piece 183 supports the connection section 912, so that the connection section 912 has sufficient strength to avoid bending and damage. The flexible circuit board extends from the main body 911 towards the direction away from the main body 911 and then is bent to be connected to the connection port 921 of the wiring board 92. The protecting layer 95 is a ring body made from a transparent material. The protecting layer 95 is arranged on the limit ring 18 and covers the flexible touchpad 91. The flexible touchpad 91 is fitted to an outer annular surface of the limit ring 18. The limit ring 18 is sleeved on and clamped with the protruding tube 14. The wiring board 92 is fixed inside the end cover 17 and electrically coupled to the flexible touchpad 91. The clamping protrusion 182 of the limit ring is clamped with the clamping concave portion 173 of the end cover, so that the end cover 17 is fixed to the limit ring 18 side by side.

In the embodiment, in order to facilitate a user rapidly finding out the position where the flexible touchpad 91 is located and ensure the operation performed on the flexible touchpad 91, the protecting layer 95 is provided with an indicator. The indicator is directed to the flexible touchpad 91. The wiring board 92 is further provided with indicating lamps 923 facing the end cover 17 and the limit ring 18, i.e., two opposite surfaces of the wiring board 92 are respectively provided with the indicating lamps 923. The indicating lamp 923 of the wiring board 92 facing the reel 20 is a side-type lighting LED, light emitted from which passes through the limit ring 18, the flexible touchpad 91, and the protecting layer 95 sequentially. The indicating lamp 923 of the wiring board 92 facing the key 94 is a direct-type lighting LED, light emitted from which passes through a perforation of the end cover 17 and the key 94. Thus, lighting to the flexible touchpad 91 and the key 94 is realized, and the user can conveniently and rapidly find out the positions where the flexible touchpad 91 and the key 94 are located to perform operations.

Figure 12:
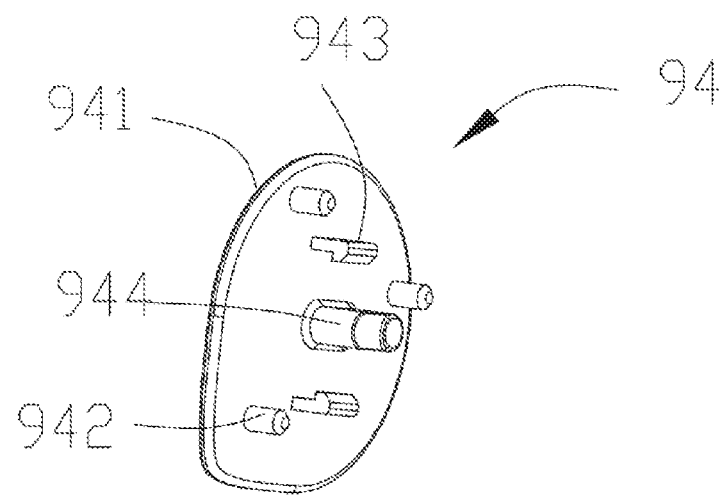
FIG. 12 is a schematic view of a driving button shown in FIG. 7, viewed from another perspective view.

Referring to FIG. 12, the key 94 has an inner surface and a pressing face 941. The key 94 is arranged on the end cover 17, and the inner surface of the key 94 faces the bottom plate 171 of the end cover 17. The inner surface is provided with pressing posts 942, limit hooks 943, and a guide post 944. The end cover 17 defines through holes 174, limit clamping grooves 176, and a guiding hole 179 on the bottom plate 171 and corresponding to the key 94. The pressing posts 942 pass through the through holes 174 to abut against the switch 93, the guide post 944 is inserted in the guide hole 179, and the limit hooks 943 are clamped in the limit clamping grooves 176. By pressing the guide post 944 of the key 94, the switch 93 is pressed and triggered, realizing actuation of the rollable and flexible input device, that is, the switch 93 is a master switch of the rollable and flexible input device.

Furthermore, the end cover 17 further defines a through groove. The wiring board 92 further defines a USB interface (not indicated in the figures). The USB interface faces and communicates with the through groove. The rollable and flexible input device can be charged via the USB interface.

Figure 11:
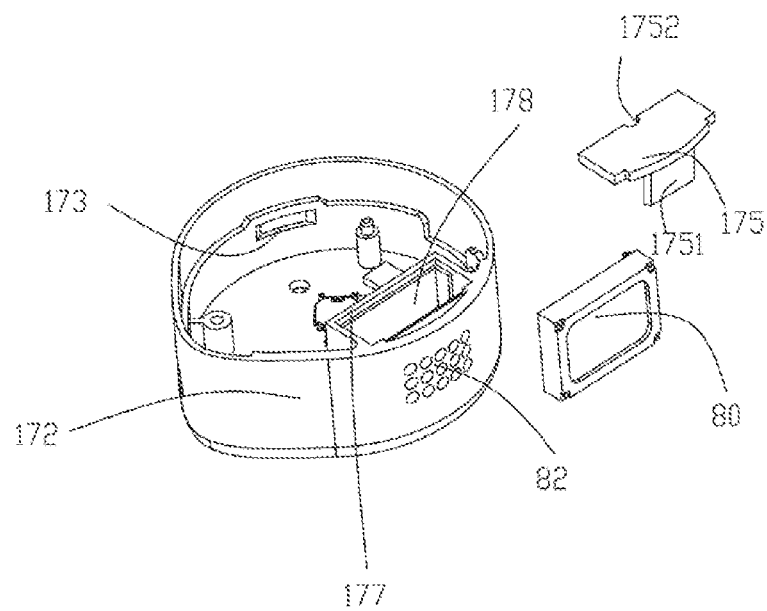
FIG. 11 is an exploded schematic view of an end cover and a second loudspeaker of the rollable and flexible input device shown in FIG. 2.

Referring to FIG. 8 and FIG. 11, the loudspeakers 70 and 80 of the present disclosure include a first loudspeaker 70 and a second loudspeaker 80. The first loudspeaker 70 and the second loudspeaker 80 are electrically coupled to the circuit board 160 and a connector plug in the installation groove 138 of the first housing. The outer end plate 15 defines a first sound hole zone 152. The first housing 11 defines a first cavity (not indicated in the figures) for receiving the first loudspeaker 70. The first cavity is located in a position of the first housing 11 adjacent to the outer end plate 15, and is closed by the outer end plate 15. The first sound hole zone 152 communicates with the first cavity. The first loudspeaker 70 is received in the first cavity, and has a sounding position oriented towards the first sound hole zone 152, thus it is more favorable to amplify the sound from the first loudspeaker 70.

In the embodiment, the first housing 11 defines a first opening groove 121 in a position of the end opening, and the first opening groove 121 is located in the first end groove 116 of the first cavity. The first opening groove 121 and the first end groove 116 have a groove wall, i.e. the first vertical plate 118 in common. The first housing 11 is further provided with a vertical spacing plate 1115 connected to the first vertical plate 118. The spacing plate 1115 has an end perpendicular to the first vertical plate 118, and another end perpendicular to the outer end plate 15. The spacing plate 115 is connected to the first vertical plate 118 and the outer end plate 15. The spacing plate, the first vertical plate 118, the outer end plate 15, and the arc-shape face 111 together define a lower portion of the first cavity, i.e. the first opening groove 121. Correspondingly, the second housing 13 defines a second opening groove 122 in a position of the end opening, and the second opening groove 122 is located in the second end groove 136 of the first cavity. The second opening groove 122 and the second end groove 136 have a groove wall, i.e. the second vertical plate 138 in common. The second housing is also provided with a spacing plate 1315 perpendicularly connected to the second vertical plate 138. The spacing plate 1315, the second vertical plate 138, and the arc-shape face 131 together define an upper portion of the first cavity, i.e. the second opening groove 122, and the second opening groove 122 communicates with the first opening groove 121 to define the first cavity. In other words, the first opening groove 121 cooperates with the second opening groove 122, and the outer end plate 15 covers a side opening of the second opening groove 122 to define the first cavity. The spacing plate separates the first loudspeaker 70 located in the first cavity from the driving portion.

Furthermore, the first cavity is provided with two opposite positioning blocks (not indicated in the figures) therein. The first loudspeaker 70 is clamped between the two positioning blocks. A boss (not indicated in the figures) protrudes from a groove wall of the first opening groove 121 with respect to the second opening groove 122, to assist in the installation and positioning of the first loudspeaker 70 in the first cavity.

Referring to FIG. 11, furthermore, the end cover 17 defines a second cavity (not indicated in the figures) for receiving the second loudspeaker 80 and a second sound hole zone 82. A sounding position of the second loudspeaker 80 is oriented towards the second sound hole zone 82. The second sound hole zone 82 communicates with the second cavity. In the embodiment, the bottom plate 171 is provided with a baffle 177. The baffle 177 is connected to the bottom plate 171 and the circumferential plate 172 to define a groove body 178. The second sound hole zone 82 is defined on the circumferential plate 172 forming a part of the groove body 178. The end cover 17 further includes a flap 175. A stop piece 1751 protrudes from a surface of the flap 175 facing the second cavity 172. The flap 175 covers the groove body 178 to define the second cavity. The stop piece 1751 extends into the second cavity to abut against the second loudspeaker 80 and position the second loudspeaker 80 in the second cavity 172. The flap 175 defines a notch 1752 on a side edge. The notch 1752 facilitates a wire of the second loudspeaker 80 to pass therethrough. The flap 175 is parallel to the bottom plate 171. The stop piece 1751 is perpendicular to the bottom plate 171.

The first loudspeaker 70 is electrically coupled to the circuit board 60 in the reel 20 by a wire which passes through a central through hole of the ratchet 42 and a perforation of the rotating shaft 26. The circuit board 60 is electrically coupled to the battery 50 by a wire which passes through a grooving of the separator 213. The battery 50 is electrically coupled to the wiring board 92 by a wire which passes through the perforation of the rotating shaft 26. The wiring board 92 is electrically coupled to the second loudspeaker 80 by a wire which passes through the notch 1752. Thus, a complete circuit loop is formed in the whole drum 10.

The loudspeakers 70 and 80 of the present disclosure can amplify audios of the electronic device 200 which employs the input device body 30. The first sound hole zone 152 and the second sound hole zone 82 are oriented to different directions, moreover, the first loudspeaker 70 and the second loudspeaker 80 are located at two ends of the drum 10, therefore, sound amplification of the first loudspeaker 70 towards sides along the axial direction and sound amplification of the second loudspeaker 80 along the radial direction and perpendicular to the axial direction of the drum 10

(i.e. towards the user's direction) can be realized, improving the sounding area and effect of the drum 10.

It can be understood that the input device body 30 of the present disclosure also can be replaced by a flexible display screen to act as a rollable display. Besides, the flexible display screen also can be used in combination with the input device body to possess more functions.

The above-mentioned are preferable embodiments of the present disclosure. It should be indicated that for a person ordinarily skilled in the art, several improvements and modifications still can be made without departing from the principle of the present disclosure, and these improvements and modifications also should be considered as the scope of protection of the present disclosure.

What is claimed is:

1. A rollable and flexible input device, comprising:
   a drum comprising:
      a protruding tube protruding from one end portion of the drum; and
      a limit ring sleeved on the protruding tube and fixed to the protruding tube via clamping;
   a reel rotatably arranged in the drum;
   an input device body connected to the reel and rolled up onto or released from the reel when the reel is rotated;
   electronic elements received in the drum; and
   a switch component comprising:
      a wiring board received in the drum and electrically coupled to the electronic elements; and
      a flexible touchpad fitted to an outer annular surface of the limit ring and electrically coupled to the wiring board, wherein the flexible touchpad is configured to receive touch operation and realize control of the electronic elements in response to user operation.

2. The rollable and flexible input device of claim 1, wherein an outer surface of the drum defines an installation groove, wherein the installation groove is configured for insertion of an external electronic device, wherein the wiring board is coupled to the external electronic device when the external electronic device is inserted into the installation groove, to electrically couple the electronic elements to the external electronic device.

3. The rollable and flexible input device of claim 2, wherein the electronic elements comprise at least one loudspeaker, wherein the flexible touchpad is configured to realize regulation of volume of the loudspeaker, and the loudspeaker is configured to amplify audios of the external electronic device.

4. The rollable and flexible input device of claim 2, further comprising a circuit board electrically coupled to the wiring board; wherein the circuit board is further electrically coupled to the external electronic device when the external electronic device is inserted into the installation groove, and the wiring board is coupled to the external electronic device through the circuit board.

5. The rollable and flexible input device of claim 4, wherein the circuit board is further electrically coupled to the input device body, wherein the input device body is electrically couple to the external electronic device through the circuit board when the external electronic device is inserted in the installation groove, to realize operation of the external electronic device through the input device body.

6. The rollable and flexible input device of claim 4, further comprising a battery electrically coupled to the wring board and the circuit board, wherein the reel defines, in its interior along an axial direction of the reel, a battery cavity for receiving the battery and a circuit board cavity for receiving the circuit board.

7. The rollable and flexible input device of claim 2, wherein the drum comprises a first housing and a second housing arranged opposite the first housing, wherein the installation groove is defined on one of the first housing and the second housing, and the other one of the first housing and the second housing defines a gap along its axial direction, wherein the input device body extends out from the drum through the gap.

8. The rollable and flexible input device of claim 1, wherein the drum is a hollow cylindrical body, and comprises a first housing and a second housing arranged opposite the first housing, wherein the first housing is buckled with the second housing to define a receiving cavity for receiving the reel and the input device body.

9. The rollable and flexible input device of claim 8, wherein the first housing comprises a plurality of clamping portions, and the second housing comprises a plurality of snapping portions corresponding to the clamping portions, wherein the first housing is buckled with the second housing by cooperation between the clamping portions and the snapping portions.

10. The rollable and flexible input device of claim 9, wherein the first housing comprises a first end portion corresponding to the one end portion of the drum, and a second end portion opposite to the first end portion and corresponding to the other one end portion of the drum, wherein the first housing defines at least one clamping groove near one of its first end portion and second end portion; the second housing comprises at least one first snap corresponding to the at least one clamping groove; wherein the first housing is buckled with the second housing by snapping the clamping groove of the first housing with the first snap of the second housing.

11. The rollable and flexible input device of claim 10, wherein the first housing further comprises at least one positioning post arranged near the other one of its first end portion and second end portion; the second housing defines at least one positioning hole corresponding to the at least one positioning post; wherein the first housing is buckled with the second housing by inserting the positioning post of the first housing in the positioning hole of the second housing.

12. The rollable and flexible input device of claim 11, wherein the first housing further comprises a second snap arranged near one of its first end portion and second end portion; the second housing further comprises a clamping protrusion corresponding to the second snap; wherein the first housing is buckled with the second housing by clamping the second snap of the first housing with the clamping protrusion of the second housing.

13. The rollable and flexible input device of claim 12, wherein the first housing further comprises a first vertical plate arranged near one of its first end portion and second end portion, wherein the second snap is arranged on the first vertical plate;
   the second housing further comprises a second vertical plate corresponding to the first vertical plate, wherein the clamping protrusion is arranged on the second vertical plate.

14. The rollable and flexible input device of claim 8, wherein the first housing comprises a first end portion corresponding to the one end portion of the drum, a second end portion opposite to the first end portion and corresponding to the other one end portion of the drum, and two first end plates arranged between the first end portion and the second end portion, wherein the first housing defines a first groove between the two first end plates;

the second housing comprises a third end portion corresponding to the one end portion of the drum, a fourth end portion opposite to the third end portion and corresponding to the other one end portion of the drum, and two second end plates arranged between the third end portion and the fourth end portion, wherein the second housing defines a second groove between the two second end plates;

wherein the first groove is butted with the second groove to define the receiving cavity.

15. The rollable and flexible input device of claim 14, wherein the first housing further comprises a first vertical plate arranged between one of the first end plates and the second end portion, wherein the first housing further defines a first end groove between the first vertical plate and the second end portion;

the second housing further comprises a second vertical plate arranged between one of the second end plates and the fourth end portion, wherein the second housing further defines a second end groove between the second vertical plate and the fourth end portion;

wherein the first end groove is butted with the second end groove to define a first cavity for receiving at least part of the electronic elements.

16. The rollable and flexible input device of claim 15, wherein the drum further comprises an outer end plate for covering an opening of the first cavity at the one end portion of the drum.

17. The rollable and flexible input device of claim 1, wherein the drum further comprises an end cover arranged at the one end portion of the drum, wherein the end cover is fixed to the limit ring via clamping, and the wring board is fixed inside the end cover.

18. The rollable and flexible input device of claim 17, wherein the end cover defines a second cavity for receiving at least part of the electronic elements.

19. The rollable and flexible input device of claim 17, wherein the end cover defines a plurality of through holes;

the switch component further comprises a switch arranged on a surface of the wiring board and a key arranged on the end cover, wherein the key includes a pressing surface, an inner surface, and a plurality of pressing posts protruding from the inner surface, wherein the pressing posts are configured to pass through the through holes to abut against the switch;

wherein the switch is triggered by pressing the pressing surface of the key, to realize actuation of the rollable and flexible input device.

\* \* \* \* \*